United States Patent [19]

Kloucek

[11] Patent Number: 4,856,702
[45] Date of Patent: Aug. 15, 1989

[54] METHOD FOR MANUFACTURING SEMICONDUCTOR COMPONENTS

[75] Inventor: Franz Kloucek, Wettingen, Switzerland

[73] Assignee: BBC Brown Boveri AG, Baden, Switzerland

[21] Appl. No.: 171,791

[22] Filed: Mar. 22, 1988

[30] Foreign Application Priority Data

Apr. 3, 1987 [CH] Switzerland .................. 1288/87

[51] Int. Cl.⁴ .............................................. B23K 1/04
[52] U.S. Cl. ...................................... 228/123; 228/102; 228/242; 228/243; 228/263.12; 219/209; 219/85.13; 29/879
[58] Field of Search ............... 228/102, 122, 123, 242, 228/188, 263.12, 9; 29/878, 879, 621; 219/209, 85 BA, 85 BM

[56] References Cited

U.S. PATENT DOCUMENTS

| 4,098,452 | 7/1978 | Webster et al. ............ 228/123 |
| 4,358,784 | 11/1982 | Wislocky et al. ............ 357/71 |
| 4,469,529 | 9/1984 | Mimura ............ 219/85 BM |

FOREIGN PATENT DOCUMENTS

| 0106598 | 4/1984 | European Pat. Off. ............ 219/209 |
| 2917165 | 1/1987 | Fed. Rep. of Germany ...... 219/209 |
| 1328185 | 8/1973 | United Kingdom ................ 219/209 |

*Primary Examiner*—Kenneth J. Ramsey
*Assistant Examiner*—Samuel M. Heinrich
*Attorney, Agent, or Firm*—Oblon, Spivak, McClelland, Maier & Neustadt

[57] ABSTRACT

In a method for manufacturing an alloy contact between a wafer-shaped semiconductor substrate (4) and a metal contact wafer (6) a material bond for which the alloy layer reaches only slightly into the interior of the semiconductor substrate (4) is achieved by individually heating the layer arrangement of semiconductor substrate (4) and contact wafer (6) and by means of thermal radiation in a vacuum and by using panel heating elements (13, 17) whose area is larger than the area of the layer arrangement.

5 Claims, 1 Drawing Sheet

METHOD FOR MANUFACTURING SEMICONDUCTOR COMPONENTS

DESCRIPTION

1. Field of the Invention

The invention relates to the field of semiconductor technology. It pertains especially to a method for manufacturing semiconductor components, in particular those of higher power, in which method a wafer-shaped semiconductor substrate is materially bonded to a metal contact wafer, and which method comprises the following steps:

arranging between the semiconductor substrate and the contact wafer to be bonded thereto at least one layer of a solder, which solder can form a eutectic alloy with the semiconductor material of the semiconductor substrate; and heating the layer arrangement of contact wafer, solder layer and semiconductor substrate to a temperature above the eutectic temperature of the alloy of solder and semiconductor material.

2. Prior Art

In the manufacture of power semiconductor components the wafer-shaped, mostly large-area semiconductor substrates are provided with a contact arrangement on both sides and built into a suitable housing.

The contact arrangements must fulfil several tasks: firstly, they must effectively dissipate the heat arising in the semiconductor substrate under load, i.e. possess a good thermal conductivity. Secondly, they serve simultaneously to supply current, i.e. the electrical conductivity must also be good. Finally, the contact arrangements must be chosen so that the component acquires a high resistance to load fluctuation, i.e. no fatigue must occur due to temperature fluctuation.

With regard to a power semiconductor component it is known, then, (see, for example, German Pat. No. 2,917,165) to construct the contact arrangement as a so-called "alloy contact" on at least one side of the semiconductor substrate. To this end, the substrate, as a rule an Si-substrate, is materially bonded by means of an aluminum solder to a supporting electrode or contact wafer of Mo or W.

In this, the solder is laid as Al-foil between semiconductor substrate and contact wafer, and the resultant layer arrangement is heated to 700° C. to 800° C. At these temperatures the solder melts and forms with the Si of the neighboring semiconductor substrate an Al-Si-alloy, which possesses a eutectic with a eutectic temperature of 577° C.

In the prior art methods, alloying was effected either by arranging many components in a stack and heating them slowly in a vacuum furnace, or by individually heating the layer arrangements to be alloyed in a continuous oven with a protective atmosphere.

The two methods share the common disadvantage that, because of the long process cycles, in homogeneous temperature distributions and high temperatures, substantial quantities of the Si of the semi-conductor substrate are dissolved locally in the solder down to sizable depths.

In this, it can happen that for power semiconductor components containing flat indiffused p-n junctions, as encountered with the GTO (Gate Turn Off) thyristors, that these p-n junctions are destroyed, so that the components become non-functional.

In addition, the protective atmosphere in the continuous furnaces leads to the repeated occurrence of bond defects, which are for example present in the form of pores or cracks in the material bond and weaken that bond.

SUMMARY OF THE INVENTION

It is then an object of the present invention to specify a method for manufacturing alloy contacts, which on the one hand is suitable for mass production, and on the other reduces to an uncritical extent the melting of the semiconductor material during the alloying process.

This object is achieved in a method of the type mentioned at the beginning when the heating of the layer arrangement takes place individually by means of thermal radiation in a vacuum, and the heating is effected with panel heating elements whose area is greater than the area of the layer arrangement to be bonded.

The core of the invention lies in using largearea panel heating elements and heating the layer arrangement by means of thermal radiation in a vacuum to create a very homogeneous temperature distribution which can be efficiently regulated and rapidly controlled. In this way, it is possible to keep to short alloying times at relatively low alloying temperatures, so that the dissolution of the semiconductor material during alloying is limited to a shallow depth and even flat p-n junctions are not endangered.

In a preferred embodiment of the invention the layer arrangement is heated between two parallel panel heating elements, in particular in the form of currentcarrying graphite sheets, the plane of the material bond between the semiconductor substrate and the contact wafer being orientated parallel to the surfaces of the panel heating elements.

Preferably, the semiconductor substrate is composed of Si, Al is used as solder and the contact wafer is composed of Mo or W.

Further forms of the invention follow from the subclaims.

BRIEF DESCRIPTION OF THE DRAWINGS

In what follows, the invention will be explained in further detail with the aid of illustrative embodiments in conjunction with the drawing, in which.

DETAILED DESCRIPTION

In what follows, the invention will be explained, without loss of generality, by reference to the example of an anode-side alloy contact for a power GTO-thyristor.

Figure 1:
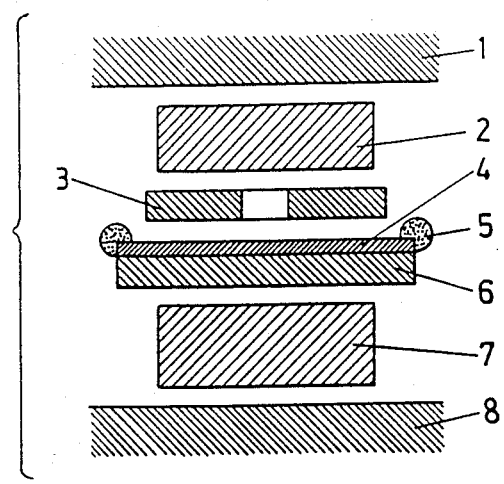
FIG. 1 shows, in a schematic sectional view, the conventional way of installing a semiconductor element of higher power using alloy contact.

The packaging, i.e. the sequence of the various parts which, arranged one above another, produce the component installed in the housing, is represented schematically in FIG. 1 for such a GTO-thyristor.

The central element is a wafer-shaped, normally round, semiconductor substrate 4, which in the interior has a series of appropriately doped layers, a diameter of the order of 10 . . . 100 mm and a thickness of the order of 0.3 . . . 0.5 mm.

By means of alloying, the semiconductor substrate 4, which is composed almost exclusively of Si, is materially bonded to a contact wafer 6 (normally of Mo or W). At the edge of the semiconductor substrate 4 is provided an edge passivation 5 intended to increase the back voltage resistance of the component.

On the side lying opposite the alloy contact the semiconductor substrate 4 is contacted from above by a further contact wafer 3, also of Mo or W.

In its turn, the stack of semiconductor substrate 4 and the two contact wafers 3, 6 lies between two compensating wafers 2, 7 (mostly of Cu), which provide the thermal contact with the heat sinks 1, 8 arranged on the outside (other than shown in FIG. 1, when the component is assembled the entire stack is in pressure contact).

Figure 2:
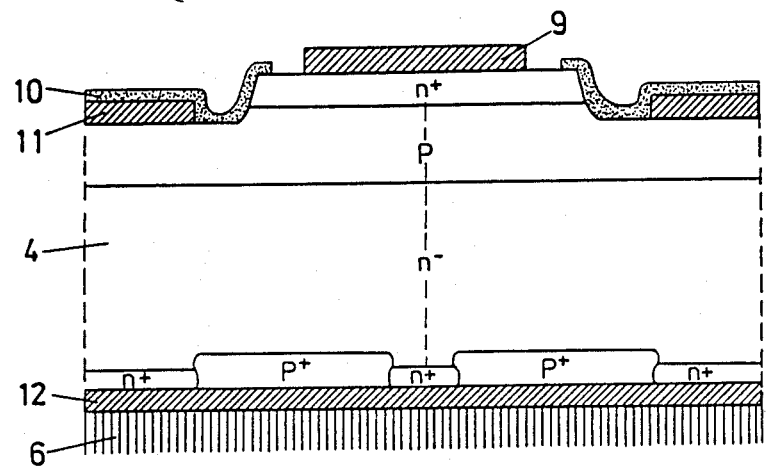
FIG. 2 shows, in a prtial view, the section through a GTO-component with alloy contact.

With a GTO-thyristor, the alloy contact of semiconductor substrate 4 and contact wafer 6 is restricted to the anode side, since the cathode must be provided with an insulating polyimide layer, as may be seen from FIG. 2.

FIG. 2 shows in partial view the cross-section through the semiconductor substrate 4 of a GTO-thyristor with alloy contact. The semiconductor substrate 4 contains from the cathode (above) to the anode (below) a plurality of alternately doped layers, of which the two upper ones ($n^+$-emitter and p-base) are provided on the cathode side with a cathode contact 9 and gate contacts 11. The gate contacts 11 are covered with the previously mentioned insulating layer 10 of polyimide.

On the anode side the semiconductor substrate 4 is materially bonded to the Mo-contact wafer 6 through a transition layer 12 (Al-Si-alloy). The p-n junctions indiffused on the anode side have a depth of only a few $\mu m$, so that the difficulty in manufacturing an alloy contact of this sort lies in restricting the dissolution of the Si-semiconductor during the alloying process to a depth which is clearly below the depth of the p-n junctions.

This is achieved in the method according to the invention by heating the layer arrangement to be bonded in a very homogeneous temperature distribution, on the one hand, and by constructing the entire heating system with a low thermal inertia, on the other hand.

Figure 3:
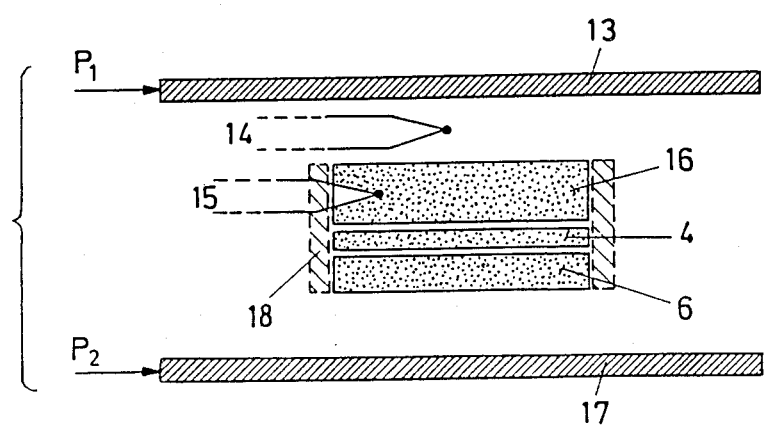
FIG. 3 shows the schematic arrangement for manufacturing an alloy contact according to a preferred illustrative embodiment of the invention.

FIG. 3 represents the schematic arrangement for the manufacture of an alloy contact in a preferred illustrative embodiment of the invention. In this proved illustrative embodiment the layer arrangement of semiconductor substrate 4 and contact wafer 6 is arranged between two parallel panel heating elements 13 and 17 in such a way that the plane of the material bond between the semiconductor substrate 4 and the contact wafer 6 is orientated parallel to the surfaces of the panel heating elements 13, 17.

Each of the panel heating elements 13 and 17 is activated by a corresponding heating power $P_1$ or $P_2$, which is then given off area-wise in the form of thermal radiation. If the panel heating elements 13, 17 are specifically graphite sheets or plates, then the heating power is fed in by means of a current flowing through the sheet.

In order to establish and maintain during the alloying process the necessary area contact between the semiconductor substrate 4, the contact wafer 6 and the solder layer lying in between it is expedient to load the layer arrangement with a weight 16, e.g. an Mo-wafer.

In order to sufficiently center the arrangement of the at first loosely stacked wafers, a ringshaped holder 18 (shown broken-lined in FIG. 3) is provided around the arrangement, preferably being composed of quartz glass and allowing the thermal radiation to pass unhindered from the panel heating elements 13, 17 to the main surfaces.

A homogeneous temperature distribution is guaranteed, on the one hand, by excluding convective processes: thus, the heating for the alloying process takes place in vacuo, preferably under a pressure of less than 1, $10^5$ mbar at 650° C., and exclusively through the exchange of thermal radiation.

On the other hand, the layer arrangement is exposed to a uniform thermal radiation only if the areas of the panel heating elements 13, 17 are chosen to be clearly larger than the areas of the wafers in the layer arrangement. Thus, during successful trials with the method according to the invention, graphite sheets each having dimensions of 100 mm×100 mm were employed in order to provide with alloy contacts semiconductor wafers having diameters of about 40 and 80 mm. The distance between the graphite sheets was chosen as $\leqq 50$ mm, and can be appropriately increased for larger areas.

In general terms it can be said that the areas of the panel heating elements 13, 17 should be designed as at least 4 times as large as the area of the layer arrangement or semiconductor wafer 4. In particular, the resultant radial temperature gradient in the layer arrangement should be kept smaller than 5K.

Finally, it is also particularly favorable to obtain precise control of the temperature conditions between the panel heating elements (and therefore in the layer arrangement), preferably with an accuracy of $\pm 2K$.

The good radiation exchange between the layer arrangement and the panel heating elements, in common with the low thermal inertia of the preferably 0.2 to 0.5 mm thick graphite sheets, enable extraordinarily precise and rapid control and regulation of temperature. For the purposes of regulation a first temperature sensor 14, e.g. an NiCr-Ni-mantle thermocouple having a diameter of 0.5 mm, is provided freely suspended between the layer arrangement and the upper panel heating element 13. A short reaction time for this first temperature sensor 14 contributes to the rapidity of the control circuit, which can be realized with a PID controller of known construction.

It is expedient to measure the temperature within the layer arrangement with a second temperature sensor 15 (a similar thermocouple as for the first temperature sensor 14), which is fitted in a deep radial bore in the weight 16.

With an arrangement as shown in FIG. 3, heating rates of 20K/min and cooling rates of 60K/min in vacuo at temperatures above 540° C. were achieved during the manufacture of alloy contacts. These high cooling rates contribute in particular to restricting the alloying process locally to the surface of the semiconductor substrate.

The method described for manufacturing alloy contacts was carried out using semiconductor substrates of Si having diameters of up to 77 mm, which were materially bonded to contact wafers of Mo (thickness 1-2.5 mm) having on each occasion the same diameter.

In all, the invention provides a method with which alloy contacts for power semiconductors can be manufactured quickly, simply and reliably, without endangering flat p-n junctions beneath the bonding surface.

By bonding Si-semiconductor substrates to Mo-contact layers it was possible under the conditions described to obtain alloy contacts reaching less than 10 μm into the semiconductor substrate.

I claim:

1. A method for manufacturing semiconductor components, in particular those of higher power, in which method a wafer-shaped semiconductor substrate on at least one substrate side is materially bonded to a metal contact wafer, and which method comprises the following steps:
   (a) arranging between the semiconductor substrate and the contact wafer to be bonded thereto at least one layer of a solder, which solder can form a eutectic alloy with the semiconductor material of the semiconductor substrate; and
   (b) heating the layer arrangement of contact wafer, solder layer and semiconductor substrate to a temperature above the eutectic temperature of the alloy of solder and semiconductor material; wherein
   (c) the heating of the layer arrangement takes place individually through thermal radiation in a vacuum; and
   (d) the heating is effected with two parallel panel heating elements, one on either side of said layer arrangement, whose area is larger than the area of the layer arrangement to be bonded, the plane of the material bond between the semiconductor substrate and the contact wafer being orientated parallel to the surfaces of the panel heating elements.

2. The method as claimed in claim 1, wherein
   (a) the panel heating elements (13, 17) are currentcarrying graphite sheets;
   (b) the heating powers ($P_1$, $P_2$) of the two panel heating elements are regulated; and
   (c) for the purposes of regulation a first temperature sensor (14) is provided between one of the panel heating elements (13, 17) and the layer arrangement.

3. The method as claimed in claim 2, wherein
   (a) in the layer arrangment the semiconductor substrate (4) is located above the contact layer (6);
   (b) the layer arrangement is loaded with a weight (16) lying on the semiconductor substrate (4); and
   (c) within the weight (16) a second temperature sensor (15) is provided for measuring the temperature in the layer arrangement.

4. The method as claimed in claim 3, wherein
   (a) the semiconductor substrate (4) is composed of Si;
   (b) Al is used as solder; and
   (c) the contact wafer (6) is composed of Mo or W.

5. The method as claimed in claim 2, wherein
   (a) the graphite sheets have a thickness of between 0.2 and 0.5 mm;
   (b) the heated area of the graphite sheets is at least 4 times as large as the area of the layer arrangement;
   (c) the vacuum at 650° C. is better than $1 \times 10^{-5}$ mbar;
   (d) the temperature in the layer arrangement is regulated with an accuracy of ±2K;
   (e) the radial temperature gradient in the layer arrangement is kept smaller than 5K; and
   (f) the layer arrangement is centered by means of a ring-shaped holder (18) of quartz glass.

* * * * *